(12) United States Patent
Lee

(10) Patent No.: US 7,189,605 B2
(45) Date of Patent: Mar. 13, 2007

(54) METHOD FOR FABRICATING SEMICONDUCTOR DEVICE

(75) Inventor: Sang Don Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 32 days.

(21) Appl. No.: 11/212,627

(22) Filed: Aug. 29, 2005

(65) Prior Publication Data
US 2006/0270153 A1    Nov. 30, 2006

(30) Foreign Application Priority Data
May 31, 2005 (KR) .................. 10-2005-0046287

(51) Int. Cl.
*H01L 21/8238* (2006.01)
(52) U.S. Cl. ............... 438/200; 438/221; 438/296; 438/587; 438/589; 438/592; 438/702
(58) Field of Classification Search ........ 438/200, 438/221, 296, 587, 589, 592, 702
See application file for complete search history.

(56) References Cited

U.S. PATENT DOCUMENTS 6,620,693 B2 * 9/2003 Lai et al. ............... 438/275
2001/0025973 A1 * 10/2001 Yamada et al. ........... 257/296

OTHER PUBLICATIONS

J.Y. Kim et al., "The Breakthrough in data retention time of DRAM using Recess-Channel-Array Transistor(RCAT) for 88nm feature size and beyond", 2003 Symposium on VLSI Technology Digest of Technical Papers, pp. 11-12.

* cited by examiner

*Primary Examiner*—M. Wilczewski
*Assistant Examiner*—Toniae M. Thomas
(74) *Attorney, Agent, or Firm*—Heller Ehrman LLP

(57) ABSTRACT

Disclosed herein is a method for fabricating a memory device. According to the present invention, a device isolation film is etched using a mask partially exposing a channel region and the device isolation film adjacent thereto during the etching process of the recess gate region, and a semiconductor substrate in the recess gate region is etched. Accordingly, a silicon horn in the recess gate region is prevented from being formed, thereby increasing a margin of the etching process.

10 Claims, 18 Drawing Sheets

(i)  (ii)

(i)  (ii)

(i)

(ii)

(i)

(ii)

METHOD FOR FABRICATING SEMICONDUCTOR DEVICE

BACKGROUND OF THE INVENTION

1. Field of the Invention

The present invention relates to fabricating a memory device. In particular, the present invention provides a method for fabricating a semiconductor device, and more specifically to a method for fabricating a semiconductor device wherein a device isolation film is etched using a mask partially exposing a channel region and the device isolation film adjacent thereto during the etching process of the recess gate region, and a semiconductor substrate in the recess gate region is etched to prevent a silicon horn in the recess gate region from being formed, thereby increasing a margin of the etching process. Although the present invention has been applied to a specific memory device, there can be other applications.

2. Discussion of the Related Art

FIG. 1 is a simplified layout of a conventional semiconductor device.

Referring to FIG. 1, a semiconductor substrate having a device isolation film 40, an active region 10a and a gate structure 120 as a word line crossing over the active region 10a is formed on a semiconductor substrate. The line width of the gate structures 120 is F, which is a minimum line width according to the design rule. A line-type recess gate region 60 is disposed under the gate structure 120. The line width of the recess gate region 60 is smaller than that of the gate structure 120 by 2D. That is, a misalignment margin of the recess gate region 60 is D.

FIGS. 2a through 2f are simplified cross-sectional views illustrating a conventional method for fabricating a semiconductor device, wherein FIGS. 2a(i) through 2f(i) are cross-sectional views taken along the line I–I' of FIG. 1, and FIGS. 2a(ii) through 2f(ii) are cross-sectional views taken along the line II–II' of FIG. 1.

Referring to FIG. 2a, a pad oxide film 20 and a pad nitride film 30 are deposited on the semiconductor substrate 10. Next, a device isolation film 40 defining an active region 10a is formed via an STI process.

Referring to FIG. 2b, the device isolation film 40 is etched to lower the height of the device isolation film 40. The nitride film 30 is then removed. Next, a polysilicon layer 50 is formed on the entire surface.

Referring to FIG. 2c, a photoresist film (not shown) is formed on the polysilicon layer 50, and then exposed and developed using an exposure mask defining the recess gate region 60 of FIG. 1 to form a line-type mask pattern (not shown) exposing the recess gate region 60 to be formed. Next, the exposed polysilicon layer 50 and the pad oxide film 20 are etched using the mask pattern as an etching mask to form a polysilicon layer pattern 50a and a pad oxide film pattern 20a defining the recess gate region 60. Thereafter, the mask pattern is removed.

Referring to FIG. 2d, the exposed semiconductor substrate 10a is etched using the polysilicon layer pattern 50a as an etching mask to form a recess gate region 70. Here, the etching process is performed to simultaneously etch the semiconductor substrate 10 and the polysilicon layer pattern 50a. At this time, the etching rate of the semiconductor substrate 10 adjacent to the device isolation film 40 is slower than that of the semiconductor substrate 10 spaced apart from the device isolation film 40, thereby forming a silicon horn 'A' on the semiconductor substrate 10 within the recess gate region 70. Next, the pad oxide film pattern 20a is removed.

Referring to FIG. 2e, a gate oxide film 80 is formed on the surface of the exposed semiconductor substrate 10. Thereafter, a lower gate electrode layer 90 filling up the recess gate region 70 is formed on the entire surface. An upper gate electrode layer 100 and a hard mask layer 110 are then sequentially deposited on the lower gate electrode layer 90.

Referring to FIG. 2f, the hard mask layer 110, the upper gate electrode layer 100 and the lower gate electrode layer 90 are patterned to form a gate structure 120 consisting of a stacked structure 120 of a lower gate electrode 90a, an upper gate electrode 100a and a hard mask layer pattern 110a.

FIG. 3 is a cross-sectional view illustrating misalignment occurring between the gate structure and the recess gate region in accordance with the conventional method for fabricating a semiconductor device.

Referring to FIG. 3, in case of misalignment occurring between a recess gate mask and a gate mask with M, which is larger than D, the misalignment margin, the semiconductor substrate under the lower gate electrode is etched in the subsequent etching process. The gate oxide film on an upper corner of the etched semiconductor substrate is degraded. In addition, concentration in one of storage node contact regions is less than that of the other in the subsequent process for forming LDD and S/D (source/drain) regions due to unbalanced recess channel region under the gate structure, thereby increasing resistance of a cell transistor adjacent to the storage node contact region having the lower concentration. As a result, operation speed of the cell transistor could slow down.

FIG. 4 is a cross-sectional view illustrating misalignment occurring in the recess gate region in accordance with the conventional method for fabricating a semiconductor device.

Referring to FIG. 4, in case of misalignment occurring between a recess gate mask and a device isolation film mask with M larger than D, the semiconductor substrate adjacent to a device isolation film is exposed as well as M-D. The exposed semiconductor substrate is simultaneously etched in the etching process of FIG. 2d. The exposed semiconductor substrate where the storage node contact in DRAM Cell is to be formed is a critical region for leakage current characteristics. The above etching of the semiconductor substrate induces increase in the leakage current, thereby degrading the refresh characteristics of DRAM.

Moreover, as shown in FIG. 2d, the etching rate of the semiconductor substrate adjacent to the device isolation film relatively slows, so that the silicon horn remains on the semiconductor substrate adjacent to the device isolation film. Accordingly, the threshold voltage of the cell transistor is decreased, thereby increasing the leakage current.

SUMMARY OF THE INVENTION

According to the present invention, techniques for fabricating a memory device are provided. In particular, the present invention provides a method for fabricating a semiconductor device, and more specifically, to a method for fabricating a semiconductor device wherein a device isolation film is etched using a mask partially exposing a channel region and the device isolation film adjacent thereto during the etching process of the recess gate region, and a semiconductor substrate in the recess gate region is etched to prevent a silicon horn in the recess gate region from being formed, thereby increasing a margin of the etching process.

Although the present invention has been applied to a specific memory device, there can be other applications.

In order to achieve the above object, an embodiment of the present invention, a method for fabricating a semiconductor device includes (a) forming a device isolation film in a semiconductor substrate to define an active region, (b) forming a first oxide film on the active region, (c) sequentially forming a first nitride film, a planarized second oxide film and a second nitride film on an entire surface, (d) etching the second nitride film and the second oxide film where a gate region is to be formed, to expose the first nitride film, (e) forming a mask pattern having a window at least exposing an island type recess gate region in the cell region, wherein the window is respectively larger than line widths of the gate region and the active region to expose the first nitride film on the active region of the gate region in the cell region and a predetermined portion of the active region and the device isolation film adjacent thereto, (f) removing the exposed first nitride film and the first oxide film etched using the mask pattern, (g) etching a predetermined thickness of the semiconductor substrate and the device isolation film exposed via removing the first oxide film to form a recessed gate region, (h) forming a gate insulating film on the exposed semiconductor substrate, (i) forming a conductive layer for lower gate electrode on an entire surface, and then etching the conductive layer for lower gate electrode until the device isolation film is exposed to form a first lower gate electrode at least filling up the recessed gate region, (j) forming a second lower gate electrode on the surface of the gate region and a third nitride film filling up the gate region, (k) removing the second oxide film, the first nitride film and the first oxide film, and then forming a third nitride film on an entire surface, (l) forming an LDD region in the semiconductor substrate at both sides of the first lower gate electrode, (m) forming a fourth nitride film and a fourth oxide film on an entire surface, and then etching only the fourth oxide film and the fourth nitride film in the peripheral circuit region to form a spacer on a sidewall of the second lower gate electrode in the peripheral circuit region and forming S/D regions on the semiconductor substrate at both sides of the spacer, (n) removing the fourth oxide film in the cell region, and then forming a fifth nitride film and a first interlayer insulating film on an entire surface and performing the CMP process to expose the third nitride film, (o) etching a predetermined region of the first interlayer insulating film, the fifth nitride film, the fourth nitride film and the third oxide film on the S/D regions in the cell region to expose the semiconductor substrate and forming the S/D regions in the exposed semiconductor substrate, (p) forming a stacked structure of a contact plug and a fifth oxide film on the S/D regions, (q) removing the third nitride film and etching a predetermined thickness of the third oxide film and the fifth oxide film, (r) sequentially forming a third lower gate electrode and a gate barrier layer on the second lower gate electrode, and then forming an upper gate electrode filling up the gate region to form a gate structure, (s) etching a predetermined thickness of the gate structure, (t) removing the exposed portion of the third oxide film, the fourth nitride film, the fifth nitride film and the fifth oxide film via an etching process, and (u) forming an upper insulating film on an entire surface, and then performing the CMP process to expose the contact plug.

In order to achieve the above object, another embodiment of the present invention, a method for fabricating a semiconductor device includes (a) forming a device isolation film in a semiconductor substrate defining an active region, (b) forming a first oxide film on the active region, (c) sequentially forming a first nitride film, a planarized second oxide film and a second nitride film on an entire surface, (d) etching the second nitride film and the second oxide film where a gate region is to be formed, to expose the first nitride film, (e) forming a mask pattern having a window at least exposing an island type recess gate region, wherein the window is respectively larger than line widths of the gate region and the active region to expose the first nitride film on the active region of the gate region in the cell region and a predetermined region of the active region and the device isolation film adjacent thereto, (f) removing the exposed first nitride film and the first oxide film etched using the mask pattern, (g) etching a predetermined thickness of the semiconductor substrate and the device isolation film exposed via removing the first oxide film to form a recessed gate region, (h) forming a gate insulating film on the exposed semiconductor substrate, (i) forming a conductive layer for lower gate electrode on an entire surface, and then etching the conductive layer for lower gate electrode until the device isolation film is exposed to form a first lower gate electrode at least filling up the recessed gate region, (j) sequentially forming a second lower gate electrode, a third lower gate electrode and a gate barrier layer on the surface of the gate region, and then forming an upper gate electrode filling up the gate region to form a gate structure, (k) etching a predetermined thickness of the exposed sidewall of the second oxide film, (l) forming an upper gate insulating film on an entire surface, and then performing the CMP process until the second oxide film is exposed, (m) forming a third oxide film on an entire surface of the cell region, (n) etching the second oxide film in the peripheral circuit region using the upper gate insulating film as an etching mask, thereby remaining of the second oxide film only on the sidewall of the gate structure, (o) forming an LDD region in the semiconductor substrate on both sides of the gate structure in the peripheral circuit region, (p) forming a gate sidewall insulating film on a sidewall of the gate structure in the peripheral circuit region, (q) forming S/D regions in the semiconductor substrate on both sides of the gate sidewall insulating film in the peripheral circuit region, (r) forming a fourth nitride film and a first interlayer insulating film on an entire surface, and then performing the CMP process until the upper gate insulating film is exposed, (s) etching a predetermined portion of the second oxide film and the first nitride film in the cell region to form a contact hole, (t) subjecting an ion implant process to the semiconductor substrate below the bottom of the contact hole to form an LDD region, (u) etching the first oxide film on the bottom of the contact hole to expose the semiconductor substrate thereunder, and then subjecting an ion implant process to the exposed semiconductor substrate to form S/D regions, and (v) forming a contact plug filling up the contact hole.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

Figure 1:
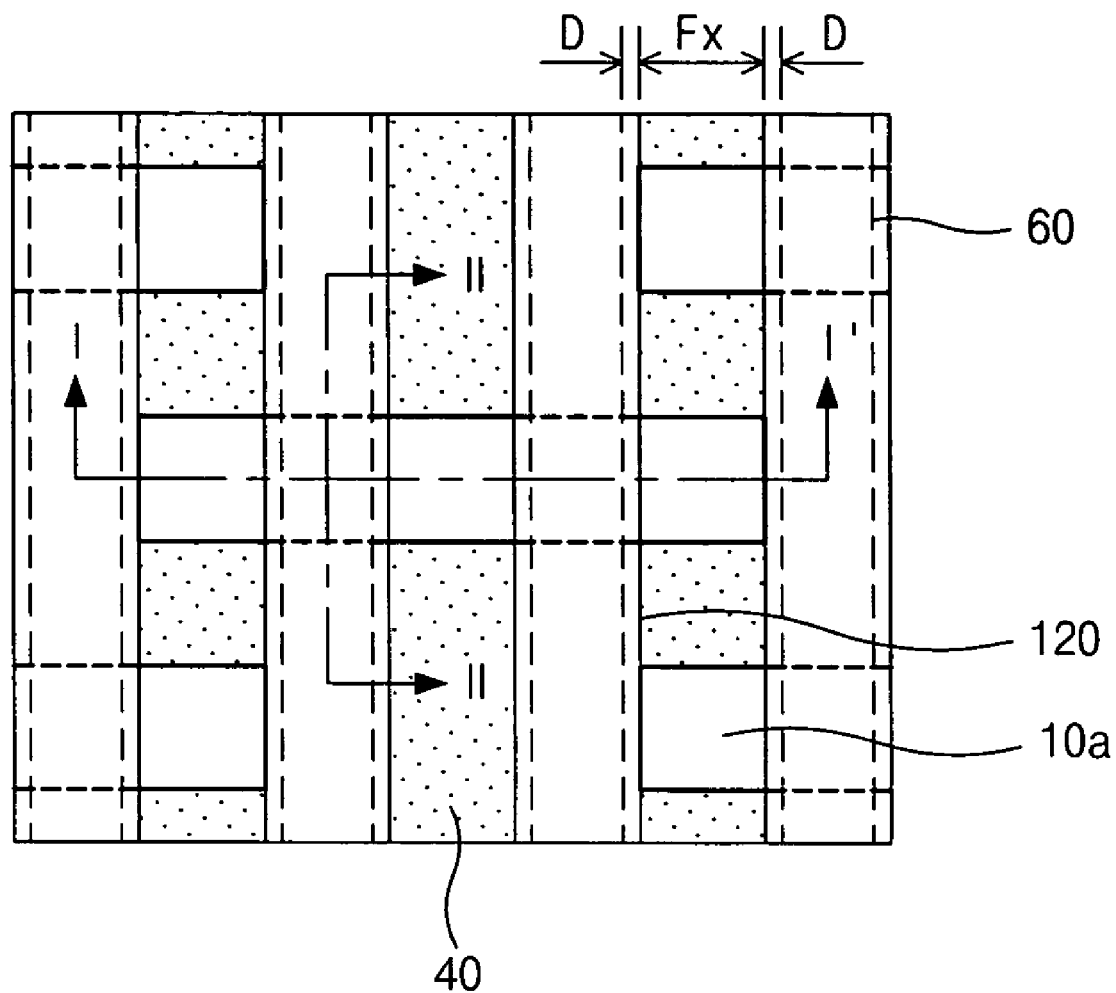
FIG. 1 is a simplified layout of a conventional semiconductor device.
Figure 2A:
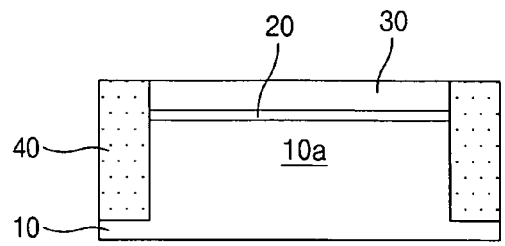
FIGS. 2a through 2f are simplified cross-sectional views illustrating a conventional method for fabricating a semiconductor device.
Figure 2A:
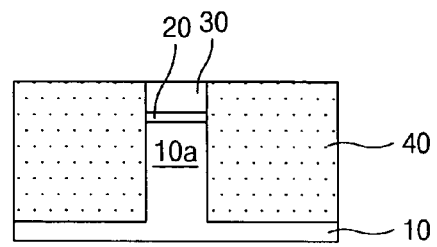
Figure 2B:
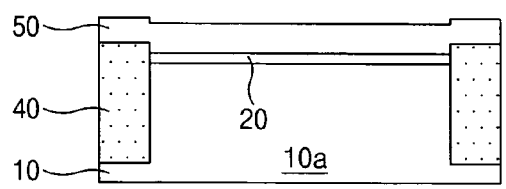
Figure 2B:
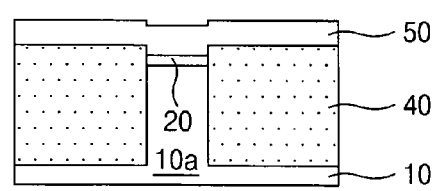
Figure 2C:
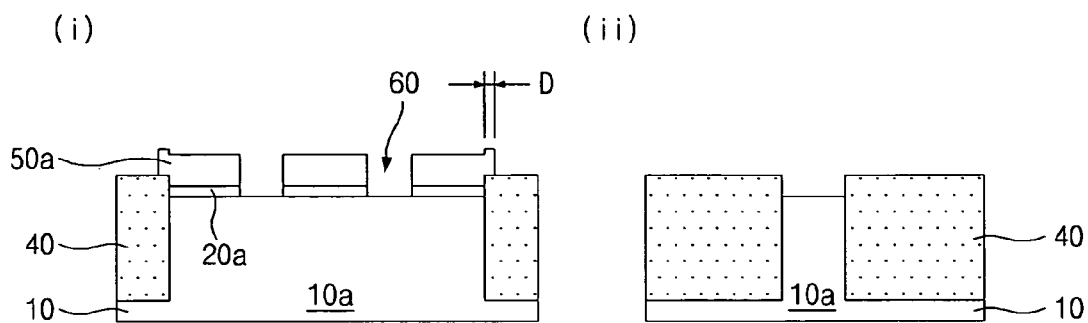
Figure 2D:
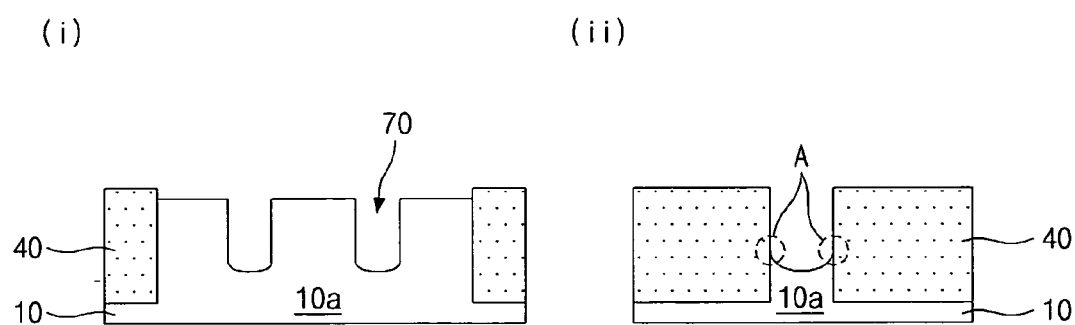
Figure 2E:
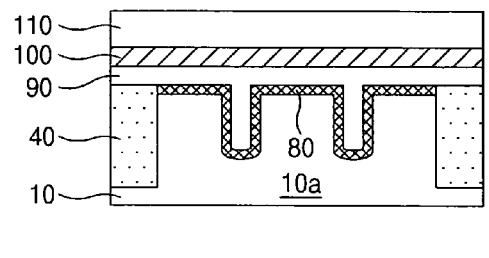
Figure 2E:
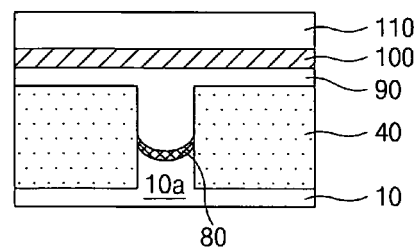
Figure 2F:
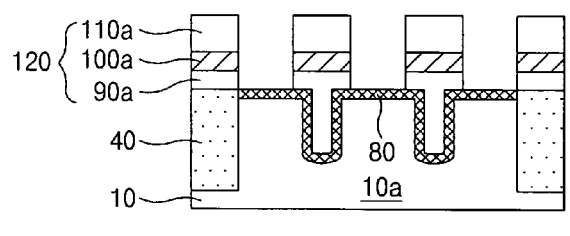
Figure 2F:
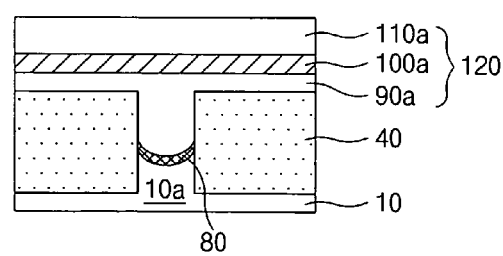
Figure 3:
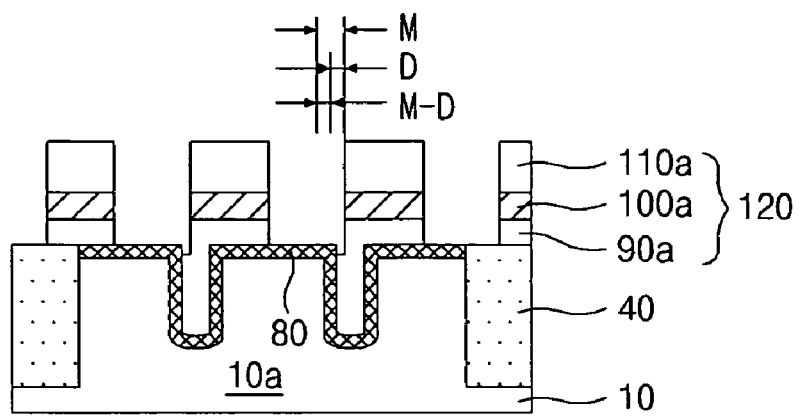
FIG. 3 is a simplified cross-sectional view illustrating misalignment occurring between the gate structure and the recess gate region in accordance with a conventional method for fabricating a semiconductor device.
Figure 4:
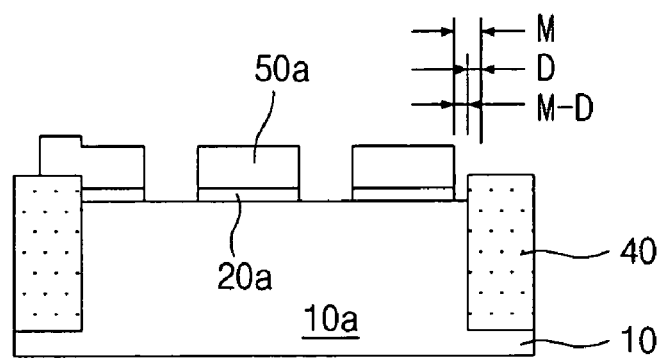
FIG. 4 is a simplified cross-sectional view illustrating misalignment occurring in the recess gate region in accordance with a conventional method for fabricating a semiconductor device.
Figure 5:
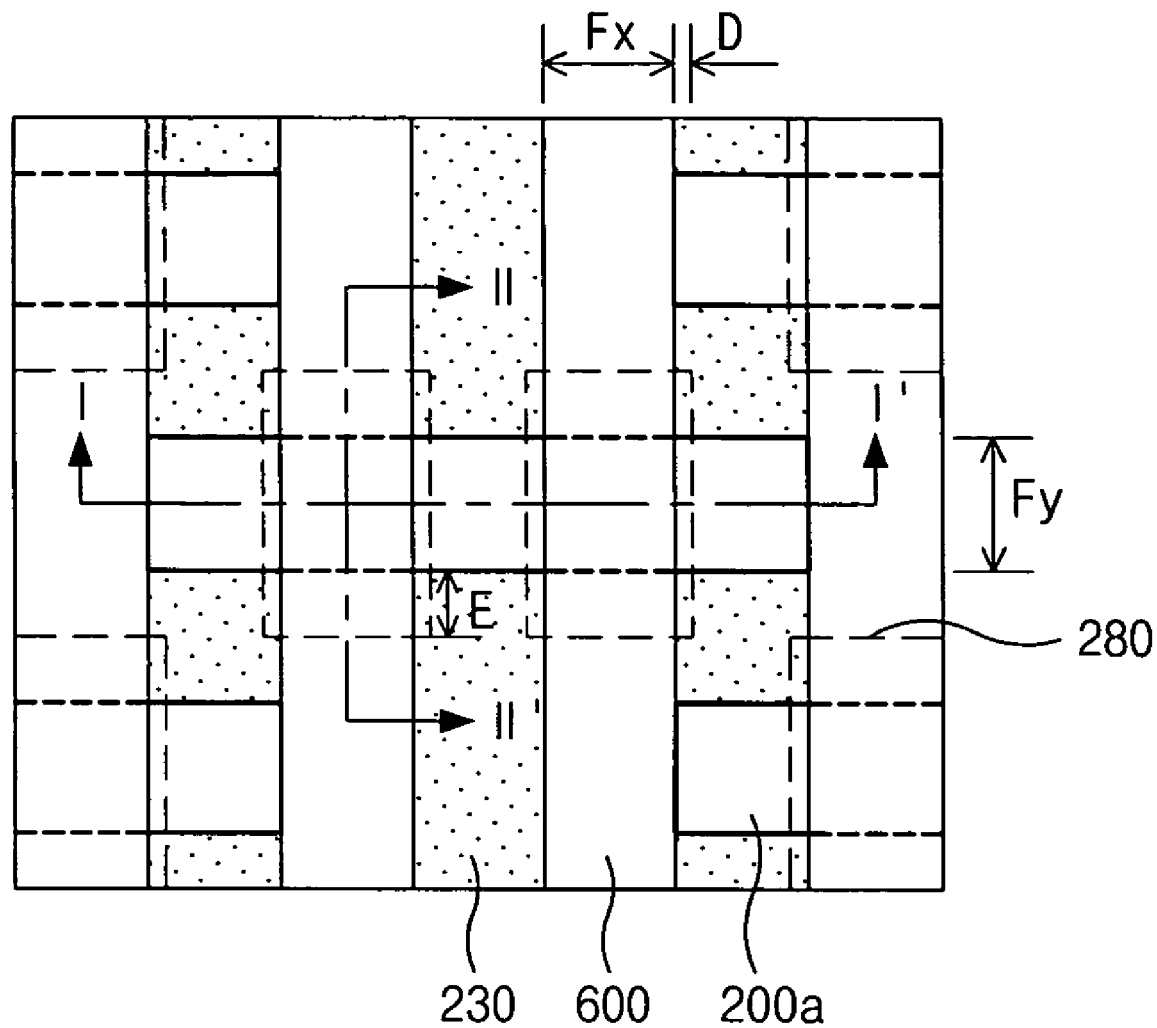
FIG. 5 is a simplified first layout of a semiconductor device in accordance with an embodiment of the present invention.
Figure 6:
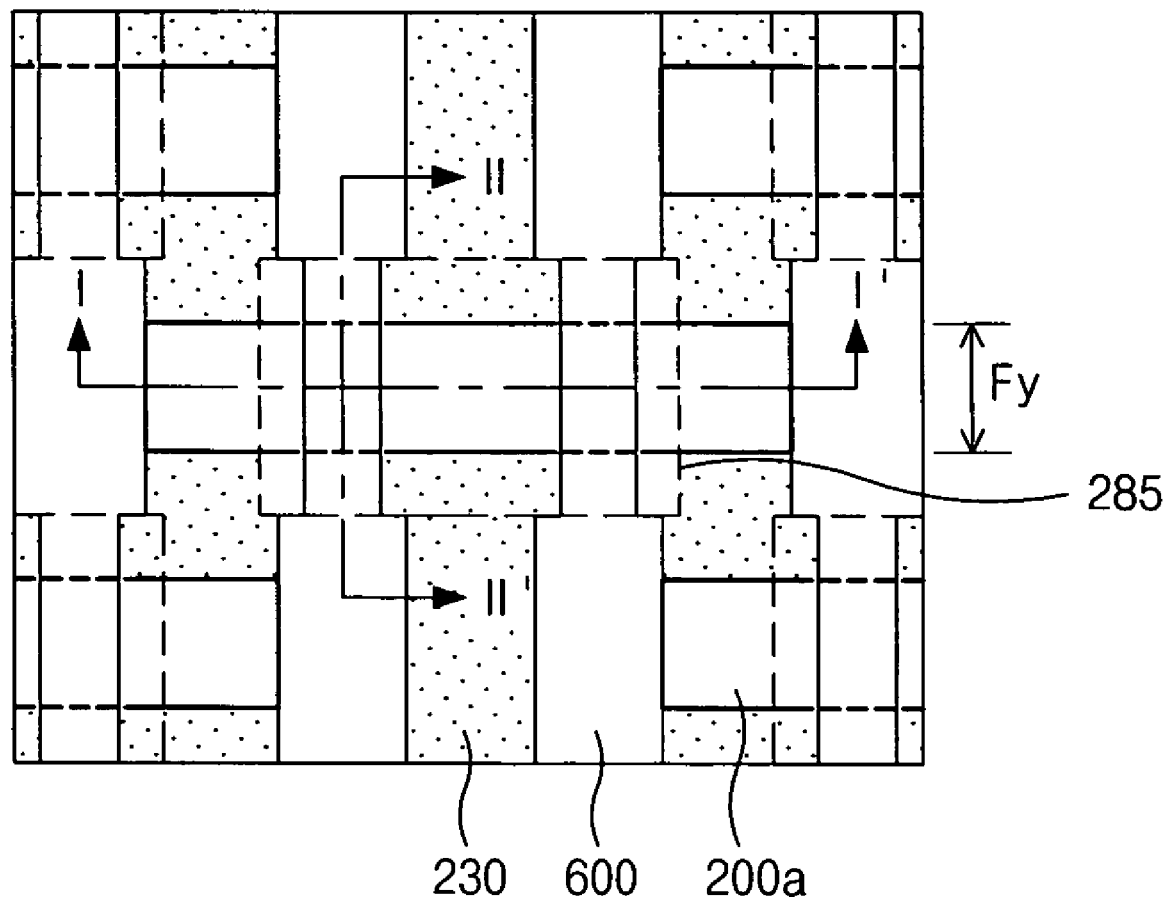
FIG. 6 is a simplified second layout of a semiconductor device in accordance with an embodiment of the present invention.
Figure 7:
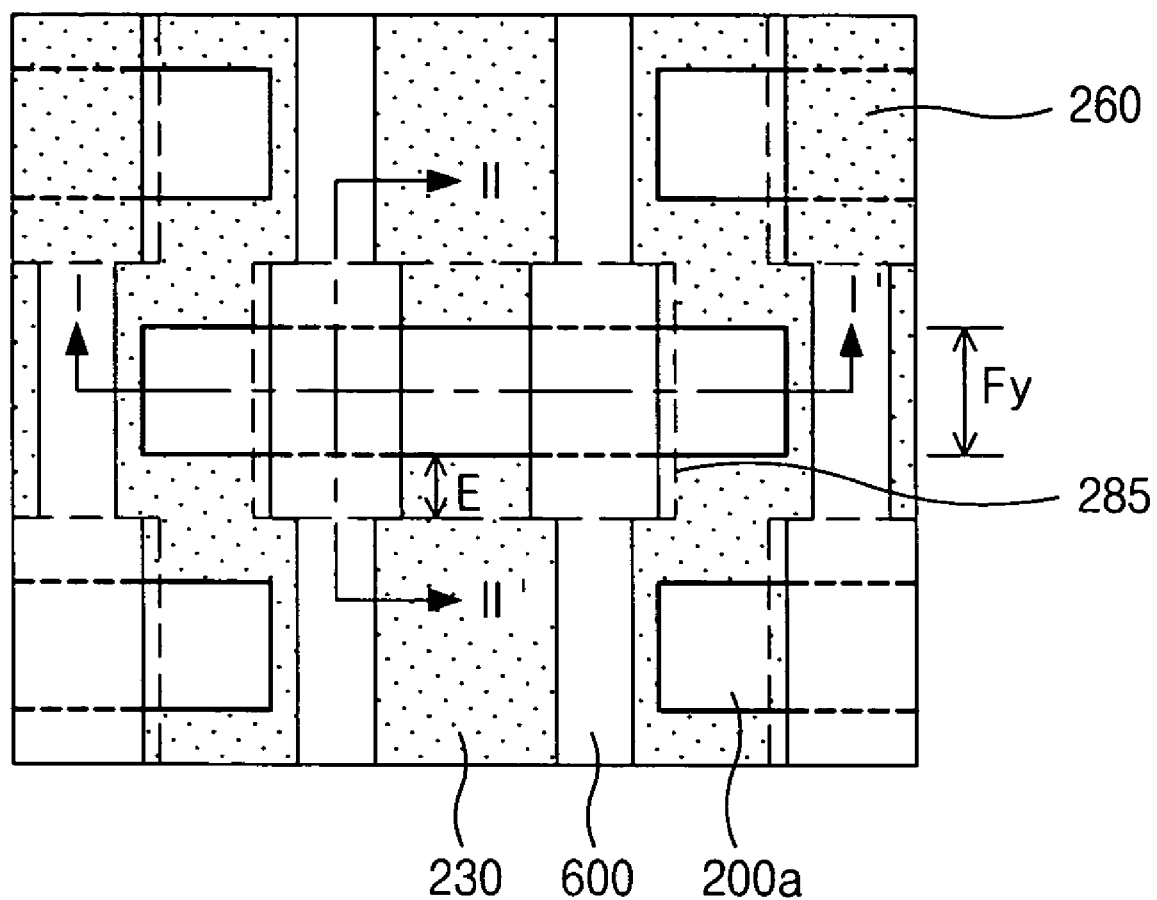
FIG. 7 is a simplified third layout of a semiconductor device in accordance with an embodiment of the present invention.

FIGS. 5 through 7 are simplified layouts of a semiconductor device in accordance with an embodiment of the present invention.

Referring to FIG. 5, a device isolation film 230, an active region 200a and a gate structure 600 as a word line crossing over the active region 200a are formed on a semiconductor substrate. A line width of the gate structure 600 is $F_x$, which is a minimum line width according to the design rule. An island type recess gate region 280 instead of a line-type one is disposed under the gate structure 600. The width of the recess gate region 280 is larger than that of the gate structure 600 by 2D and the height of the recess gate region 280 is larger than a line width $F_y$ of the active region 200a by 2E, where $-(\frac{1}{3})F_x \leq D \leq 0.5F_x$ and $0 \leq E \leq 0.5F_y$. It notes that the recess gate region 280 shown in FIG. 5 depicts a region defined by an exposure mask.

FIG. 6 is a simplified second layout of a semiconductor device in accordance with an embodiment of the present invention. Compared with FIG. 5, FIG. 6 shows that the recess gate region 280 defined by the exposure mask includes two cell transistor regions. The line width of the gate structure 600 in the recess gate region 280 is smaller than that on the device isolation film 230.

FIG. 7 is a simplified third layout of a semiconductor device in accordance with an embodiment of the present invention. Compared with FIG. 5, FIG. 7 also shows that the recess gate region 280 defined by the exposure mask includes two cell transistor regions. The line width of the gate structure 600 in the recess gate region 280 is larger than that on the device isolation film 230.

Figure 8A:
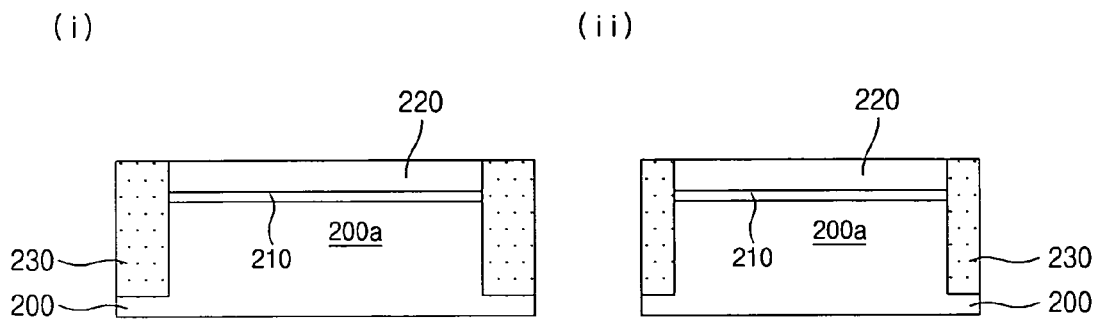
FIGS. 8a through 8k are simplified cross-sectional views illustrating a method for fabricating a semiconductor device in accordance with a first embodiment of the present invention.

FIGS. 8a through 8k are simplified cross-sectional views illustrating a method for fabricating a semiconductor device according to a first embodiment of the present invention, wherein FIGS. 8a(i) through 8k(i) are simplified cross-sectional views taken along the line I–I' of FIG. 5 and FIGS. 8a(ii) through 8k(ii) are simplified cross-sectional views taken along the line II–II' of FIG. 5.

Referring to FIG. 8a, a device isolation film 230 defining an active region 200a is formed via an STI process. In particular, a pad oxide film 210 and a pad nitride film 220 and a photoresist film (not shown) are deposited on the semiconductor substrate 200. The photoresist film is then exposed and developed using a device isolation mask for defining a device isolation region to form a mask pattern (not shown) exposing the device isolation region to be formed. Next, a predetermined region of the pad nitride film 220, the pad oxide film 210 and a predetermined thickness of the semiconductor substrate 200 are sequentially etched using the mask pattern to form a trench for device isolation (not shown). The mask pattern is then removed. Thereafter, an oxide film (not shown) filling up the trench for device isolation is formed on the entire surface. The oxide film is polished using a CMP process until the pad nitride film 220 is exposed to form a device isolation film 230 defining the active region 200a.

Figure 8B:
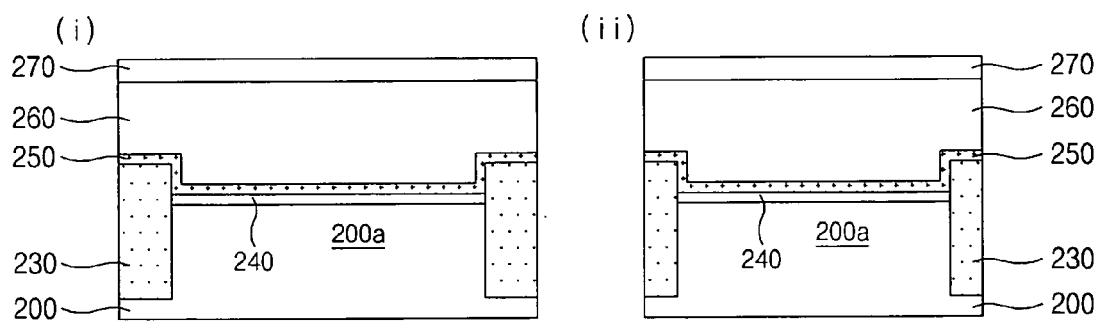

Referring to FIG. 8b, the pad nitride film 220 is removed using a wet-etching method. A photoresist film (not shown) is then formed on the entire surface. Next, the photoresist film is exposed and developed using a well ion implantation mask to form a mask pattern (not shown) defining a predetermined well region. Next, a predetermined ion implantation process is performed to form a deep n-type well region, a cell well region, an n-type well region and a p-type well region, respectively. The mask pattern is then removed. Preferably, a channel ion implantation process as well as the well ion implantation process can be performed for adjusting a threshold voltage of a transistor formed on each regions. After that, a first oxide film 240 is formed on the semiconductor substrate 200 after the pad oxide film 210 is removed. Next, a first nitride film 250, a planarized second oxide film 260 and a second nitride film 270 are deposited on the entire surface. Here, a polysilicon layer instead of the first nitride film 250 can be formed after the formation of the first oxide film 240. The thick, planarized second oxide film 260 and the second nitride film 270 can be then formed on the polysilicon layer.

Figure 8C:
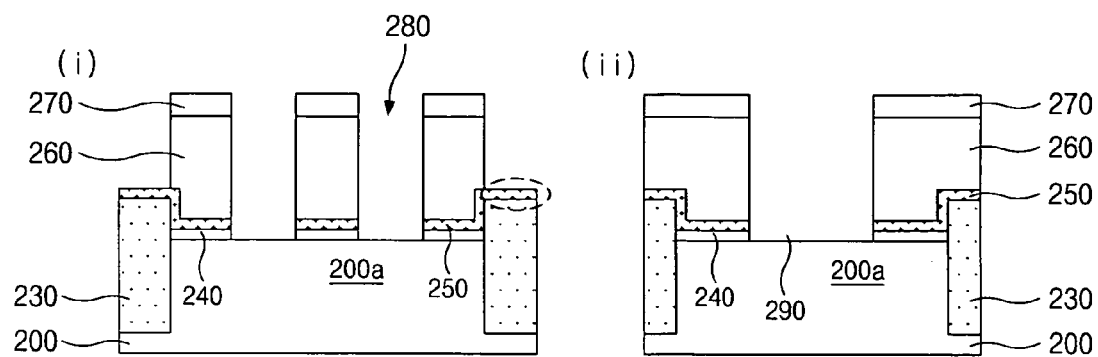

Referring to FIG. 8c, a photoresist film (not shown) is formed on the second nitride film 270, and then exposed and developed using a gate mask (not shown) defining a gate region 280 to a mask pattern (not shown) exposing the gate region 280. Next, a predetermined region of the second nitride film 270 and the second oxide film 260 is etched using the mask pattern. The mask pattern is then removed. Thereafter, a photoresist film (not shown) is formed on the entire surface, and then exposed and developed using a recess gate mask defining a recess gate region 280 of one of FIGS. 5, 6 and 7 to form a mask pattern (not shown) to expose the first nitride film 250 of the recess gate region 280 to be formed. Here, the mask pattern defining the recess gate region 280 exposes a predetermined region, wherein the predetermined region is larger than the line width of the gate region 280 by 2D and the line width $F_y$ of the active region 200a by 2E, respectively. That is, in case of an exposure and development process using an exposure mask defining the recess gate region 280 shown in FIG. 5, a mask pattern having an island type window defining two recess gate regions in an active region is formed. In case of an exposure and development process using an exposure mask defining the recess gate region 280 shown in FIG. 6 or FIG. 7, a mask pattern having an island type window defining one recess gate region in an active region is formed. Next, the exposed first nitride film 250 and first oxide film 240 are sequentially etched to expose the semiconductor substrate 200 and the device isolation film 230 in the recess gate region 280. The mask pattern is then removed. Here, the mask pattern formed using the recess gate mask according to the present invention exposes only the recess gate region in the cell transistor. As a result, the first nitride film 250 on the device isolation film 230 denoted by a dotted circle remains during the etching process. Thereafter, a predetermined thickness of the device isolation film 230 in the recess gate region 280 is etched. Here, the predetermined thickness of the device isolation film 230 can be adjusted according to an etched thickness of the semiconductor substrate 200 in the subsequent etching process of FIG. 8*d*. Accordingly, the etched thickness of the device isolation film 230 can be equal to or greater than that of the semiconductor substrate 200. FIG. 9 is a simplified cross-sectional view illustrating the device isolation film 230 after the etching process, which is taken along the line II–II' of FIG. 5.

Figure 8D:
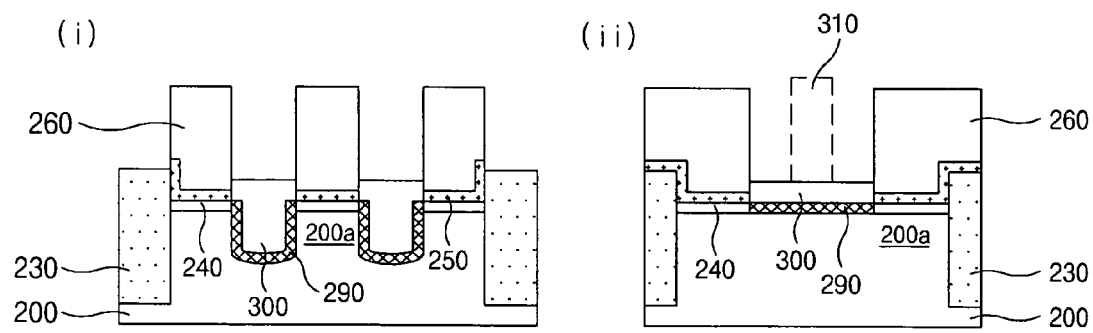
Figure 9:
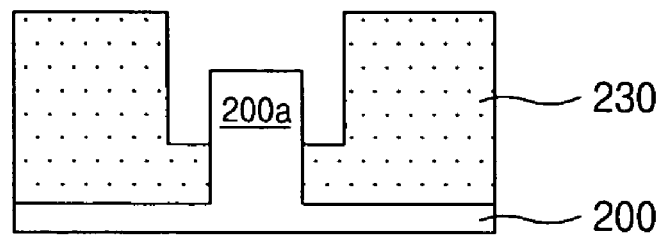
FIG. 9 is a simplified cross-sectional view taken along the line II–II' of FIG. 5 after the step of FIG. 8c.
Figure 10:
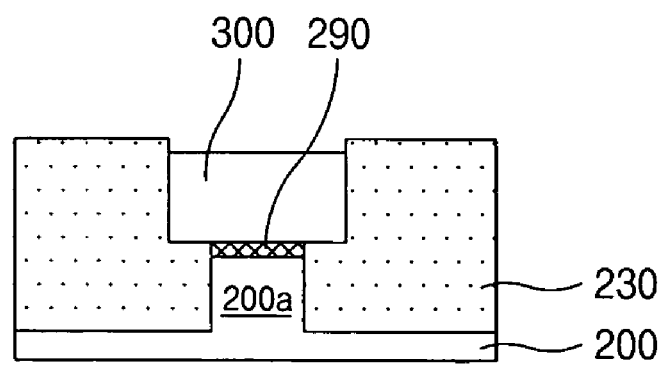
FIG. 10 is a simplified cross-sectional view taken along the line II–II' of FIG. 5 after the step of FIG. 8d.

Referring to FIG. 8*d*, the exposed semiconductor substrate 200 is etched to form a recess gate region in the cell region. A gate insulating film 290 is then formed on the surface of the exposed semiconductor substrate 200. Next, a first lower gate electrode layer (not shown) is formed on the entire surface. A photoresist film (not shown) is coated and planarized on the first lower gate electrode layer. Here, the width of the gate region in the cell region is smaller than that in the peripheral circuit region. As a result, the gate region in the cell region is completely filled up, whereas the gate region in the peripheral circuit region is not completely filled up. Thereafter, the photoresist film is etched until the first lower gate electrode layer is exposed to form a photoresist film pattern 310. The first lower gate electrode layer on the second nitride film 270 is etched using the remaining photoresist film pattern 310 as an etching mask to form a first lower gate electrode 300, and further etched until the device isolation film 230 is exposed. The photoresist film pattern 310 is then removed. At this time, the first lower gate electrode 300 between the sidewall of the second oxide film 260 and the photoresist film pattern 310 in the peripheral circuit region is etched. FIG. 10 is a simplified cross-sectional view illustrating FIG. 8*d*(*i*) taken along the line II–II' of FIG. 5.

Here, the first lower gate electrode 300 may remain on the device isolation film 230 in the cell region. In accordance with the second embodiment of the present invention, the thick first lower gate electrode layer (not shown) is deposited so as to completely fill up the etched portion in the cell. A nitride film (not shown) and a photoresist film (not shown) is deposited on the first lower gate electrode layer. The photoresist film is then etched until the nitride film is exposed to form a photoresist film pattern 310. Next, the exposed nitride film is etched using the photoresist film pattern 310 as an etching mask. The first lower gate electrode layer is then etched until the second oxide film 260 is exposed to form a first lower gate electrode 300. Thereafter, the first lower gate electrode 300 is etched until the device isolation film 230 in the cell region is exposed. The photoresist film pattern 310 is then removed. The remaining nitride film on the first lower gate electrode 300 of the gate region in the peripheral circuit region can be removed via the wet-etching method. In accordance with the third embodiment of the present invention, the thick first lower gate electrode layer (not shown) is deposited so as to completely fill up the etched portion in the cell and peripheral circuit regions instead of the formation of the first lower gate electrode layer to completely fill up the etched portion in the cell region. A nitride film (not shown) is formed on the first lower gate electrode layer. The nitride film and the first lower gate electrode layer are polished via a CMP process until the nitride film is removed and the second oxide film 260 is exposed to form a first lower gate electrode 300. Further, the first lower gate electrode 300 can be etched until the device isolation film 230 in the cell region is exposed.

Due to the recess gate mask in accordance with the present invention, the first lower gate electrode 300 in the cell region is concavely formed extending to the recessed semiconductor substrate only in a cell transistor to be formed. Accordingly, even though misalignment M larger than the misalignment margin D occurs, the semiconductor substrate 200 in the storage node contact region is not etched during the etching process due to the first nitride film 250 and the first oxide film 240 thereon.

Figure 8E:
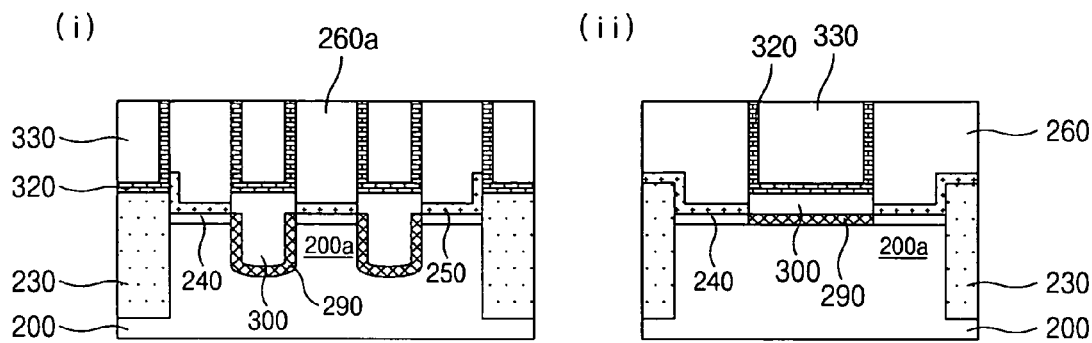
Figure 8F:
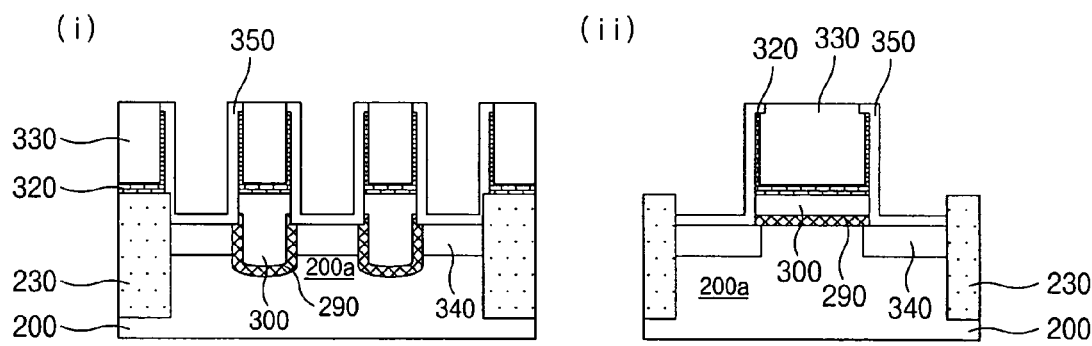

Referring to FIG. 8*e*, a conductive layer for second lower gate electrode is formed on the entire surface. A third nitride film 330 is formed on the conductive layer for second lower gate electrode to completely fill up the gate region in the cell and the peripheral circuit regions. Next, the third nitride film 330 and the conductive layer for second lower gate electrode are etched via a CMP process until the second oxide film 260 is exposed to form the second lower gate electrode 320. Here, the third nitride film 330 is etched via a wet-etching method until the conductive layer for second lower gate electrode on the second oxide film 260 is exposed. The conductive layer for second lower gate electrode on the second oxide film 260 can be then etched.

Referring to 8*f*, the second oxide film 260 is removed via an etching process using the exposed third nitride film 330 and the second lower gate electrode 320 as an etching mask. The exposed first nitride film 250 is then removed via a wet-etching method. Next, a predetermined ion implantation process is performed to form an LDD region 340 on the cell and n/p-MOS transistors in the peripheral circuit region, respectively. Thereafter, a third oxide film 350 is formed on the entire surface after the first oxide film 240 is removed via a wet-etching method. Here, the third oxide film 350 is formed after the first oxide film 240 is removed via a wet-etching method. A predetermined ion implantation process may be then performed to form an LDD region 340 on the cell and n/p-MOS transistors in the peripheral circuit region, respectively. Moreover, a Halo ion implantation region (not shown) can further be formed.

Figure 8G:
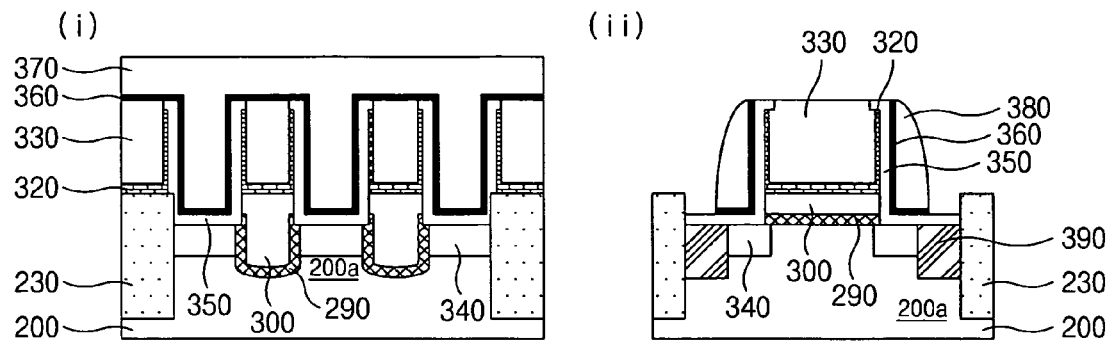

Referring to FIG. 8*g*, a fourth nitride film 360 is formed on the entire surface. A fourth oxide film 370 is formed on the fourth nitride film 360. Next, a mask pattern for exposing the peripheral circuit region is formed. The fourth oxide film 370 and the fourth nitride film 360 in the peripheral circuit region are sequentially etched using the mask pattern as an etching mask to form a gate sidewall insulating film 380. The remaining mask pattern is then removed. Thereafter, a predetermined ion implantation process is performed to form S/D regions 390 in the semiconductor substrate 200 at both sides of the gate sidewall insulating film 380 in the peripheral circuit region.

Figure 8H:
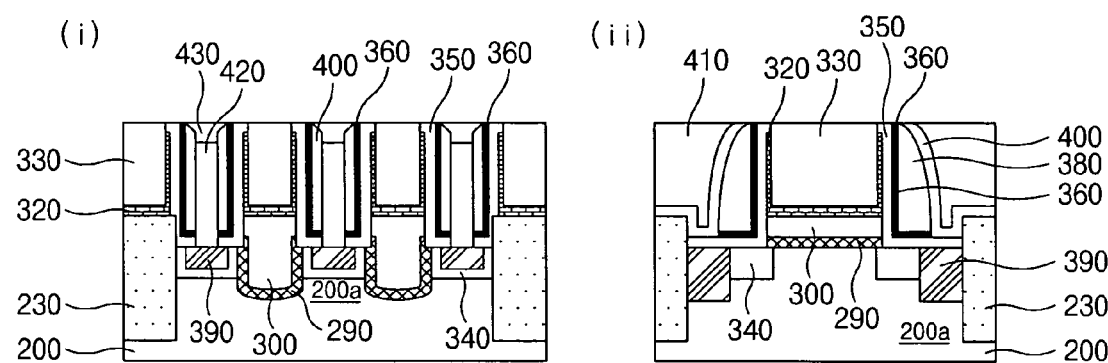

Referring to FIG. 8*h*, a photoresist film (not shown) is formed on the entire surface, and then exposed and developed to form a mask pattern (not shown) exposing the cell region. Next, the exposed fourth oxide film 370 in the cell region is removed via a wet-etching method using the mask pattern. The mask pattern is then removed. Thereafter, a thin fifth nitride film 400 is deposited on the entire surface. A first interlayer insulating film 410 is deposited on the fifth nitride film 400, and then etched via a CMP process to expose the third nitride film 330. Here, the fourth oxide film 370 is removed via a wet-etching method. The first interlayer insulating film 410 can be then formed on the entire surface without the formation of the fifth nitride film 400. Next, a photoresist film (not shown) is formed on the entire surface, and then exposed and developed to form a mask pattern exposing a contact plug region to be formed in the cell region. Thereafter, a predetermined region of the first interlayer insulating film 310, the fifth nitride film 400, the fourth nitride film 360 and the third oxide film 350 is etched using the mask pattern to expose the semiconductor substrate 200 in the contact plug region. After that, the exposed semiconductor substrate 200 is subjected to an ion implantation process including one of P and As to form S/D regions 390 in the cell transistor. Next, a conductive layer for plug (not shown) is formed on the entire surface to fill up the contact plug region to be formed. The conductive layer for plug is then etched via a CMP process until the third nitride film 330 is exposed to form a contact plug 420. Thereafter, a predetermined thickness of the contact plug 420 is recessed via an etching process. A fifth oxide film 430 is then formed on the contact plug 420.

Figure 8I:
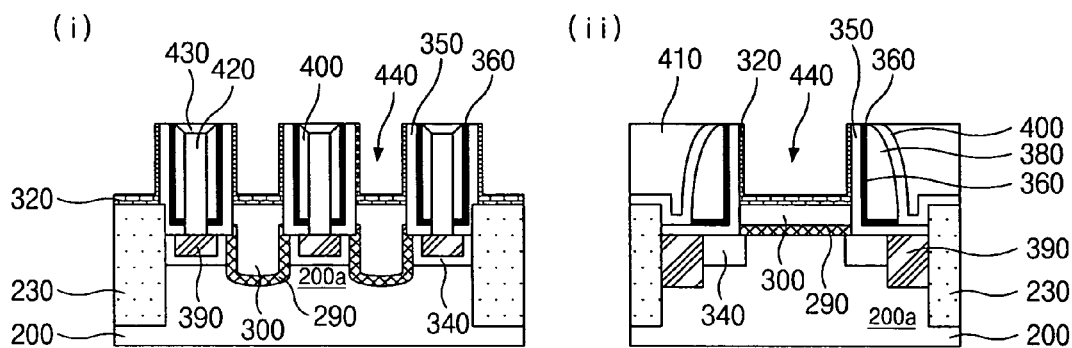

Referring to FIG. 8i, the third nitride film 330 is removed via a wet-etching method to form a gate region 440 exposing the second lower gate electrode 320. A predetermined thickness of the exposed third oxide film 350 and fifth oxide film 430 is etched via a wet-etching method.

Figure 8J:
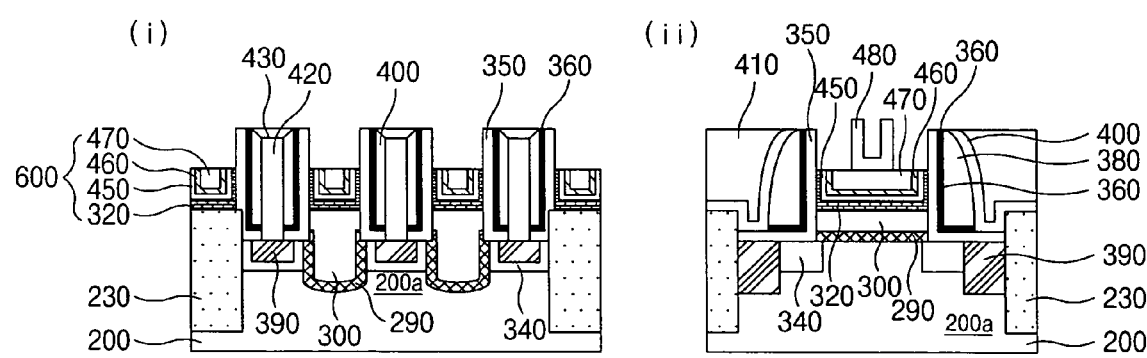

Referring to FIG. 8j, a conductive layer for third lower gate electrode (not shown) and a metal layer for gate barrier are formed on the exposed second lower gate electrode 320. A conductive layer for upper gate electrode (not shown) filling up the gate region 440 is then formed on the metal layer for gate barrier (not shown). Here, the gate region 440 is completely filled up due to the relatively narrow line width thereof, whereas a step difference occurs on the gate region 440 in the peripheral circuit region due to the relatively wide line width of the gate region 440. Next, a thin sixth nitride film 480 is formed on the entire surface. A planarized photoresist film (not shown) is formed on the sixth nitride film 480. Thereafter, the photoresist film is etched via a dry-etching method until the sixth nitride film 480 in the peripheral circuit region is exposed. The exposed sixth nitride film 480, the conductive layer for upper gate electrode (not shown), the metal layer for gate barrier (not shown) and the conductive layer for third lower gate electrode (not shown) are sequentially etched to expose the first interlayer insulating film 410. Next, in order to form a planarized gate electrode on the gate insulating film 290 in the peripheral circuit region, a predetermined thickness of the exposed conductive layer for upper gate electrode, the metal layer for gate barrier, the conductive layer for third lower gate electrode and the conductive layer for second lower gate electrode is etched back to form a gate structure 600 comprising an upper gate electrode 470, a gate barrier layer 460, a third lower gate electrode 450 and a second lower gate electrode 320. The photoresist film is then removed. Here, the gate barrier layer 460 can be formed on the second lower gate electrode 320 without the formation of the third lower gate electrode 450, or the upper gate electrode 470 can be formed on the third lower gate electrode 450 deposited on the second lower gate electrode 320 without the formation of the gate barrier layer 460. Moreover, the upper gate electrode 470 is directly formed on the second lower gate electrode 320 without the formation of the third lower gate electrode 450 and the gate barrier layer 460.

Figure 8K:
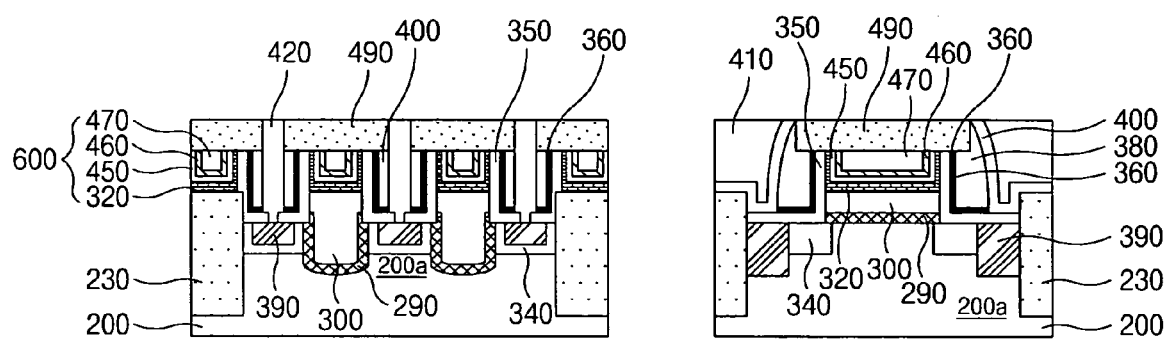

Referring to FIG. 8k, the sixth nitride film 480 is removed via a wet-etching process. The third oxide film 350 and the fifth oxide film 430 in the cell region are etched via a wet-etching method. Next, a predetermined thickness of the fourth nitride film 360 and the fifth nitride film 400 is etched via a wet-etching method. Preferably, a thick upper gate insulating film 490 is formed to fill up the gate region 440 in the cell and the peripheral circuit regions, and then etched via a CMP process until the first interlayer insulating film 410 is exposed.

The well-known process for fabricating a cell transistor as the subsequent processes such as a process for forming a second interlayer insulating film, a process for forming a bit line contact and a bit line, a process for forming a capacitor contact and a capacitor, a process for forming a third interlayer insulating film, and a process for forming interconnect contact and interconnect can be performed to completely manufacture a DRAM.

Figure 11A:
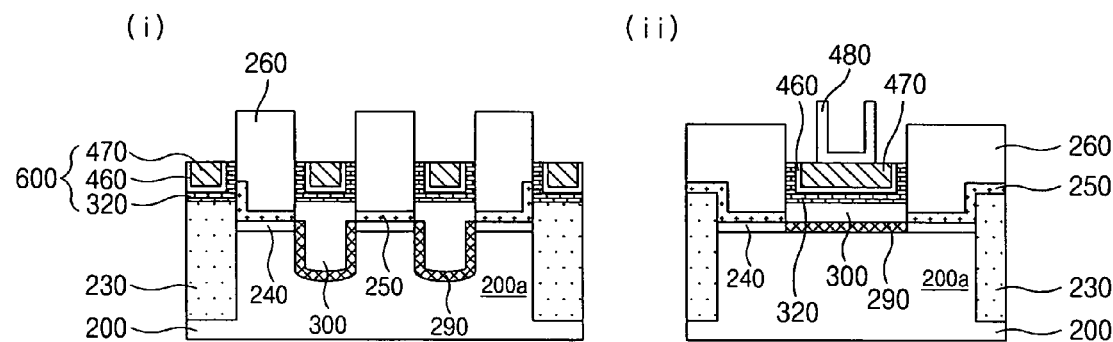
FIG. 11a through 11f are simplified cross-sectional views illustrating a method for fabricating a semiconductor device in accordance with a second embodiment of the present invention.

FIGS. 11a through 11f are simplified cross-sectional views illustrating a method for fabricating a semiconductor device according to a second embodiment of the present invention, wherein FIGS. 11a(i) through 11f(i) are simplified cross-sectional views taken along the line I–I' of FIG. 5 and FIGS. 11a(ii) through 11f(ii) are simplified cross-sectional views taken along the line II–II' of FIG. 5.

At first, the processes shown in FIGS. 8a through 8d are performed to form the structure shown in FIG. 8d.

Referring to FIG. 11a, a conductive layer for second lower gate electrode (not shown) and a metal layer for gate barrier (not shown) are sequentially formed on the exposed first lower gate electrode 300. Next, a conductive layer for upper gate electrode (not shown) filling up the gate region in the cell region is formed on the metal layer for gate barrier. Thereafter, a third nitride film 480 and a photoresist film (not shown) are formed on the entire surface. The photoresist film is etched via a dry-etching method until the third nitride film 480 in the peripheral circuit region is exposed. The third nitride film 480, the conductive layer for upper gate electrode, the metal layer for gate barrier, and the conductive layer for second lower gate electrode are sequentially etched using the remaining photoresist film to expose the second oxide film 260. Next, a predetermined thickness of the conductive layer for upper gate electrode, the metal layer for gate barrier and the conductive layer for second lower gate electrode is etched using the remaining photoresist film and second oxide film 260 to form a second lower gate electrode 320, a gate barrier layer 460 and an upper gate electrode 470. Preferably, the conductive layer for upper gate electrode, the barrier layer for gate barrier and the conductive layer for second lower gate electrode are etched until the gate electrode on the gate insulating film in the peripheral circuit region is planarized as shown in FIG. 11a. Next, the remaining photoresist film and the third nitride film 480 are removed.

Figure 11B:
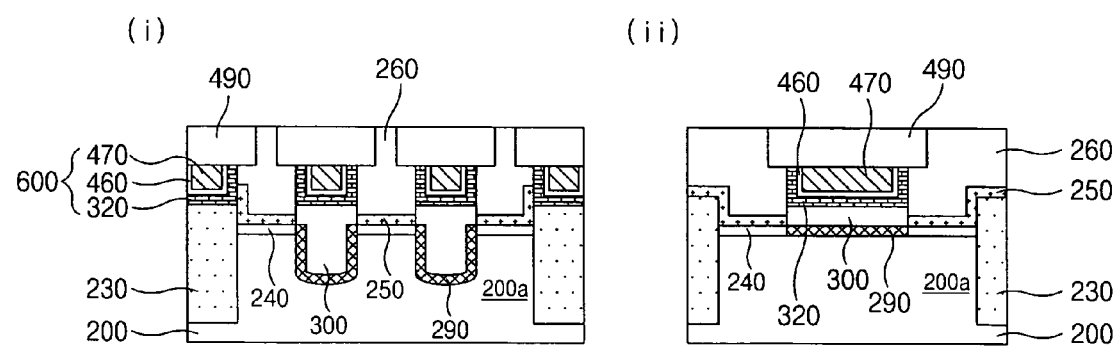

Referring to FIG. 11b, a predetermined thickness of the sidewall of the exposed second oxide film 260 is etched via a wet-etching method. A thick gate upper insulating film 490 is formed on the entire surface to fill up the gate region in the cell and the peripheral circuit regions, and then etched via a CMP process until the second oxide film 260 is exposed.

Figure 11C:
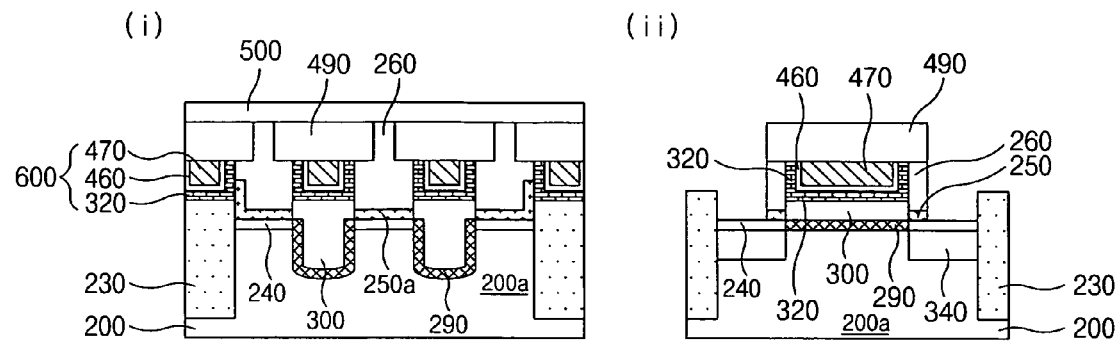

Referring to FIG. 11c, a third oxide film 500 is formed on the entire surface. A mask pattern (not shown) is formed on the third oxide film 500 to expose only a core and peripheral circuit region. Next, the exposed third oxide film 500 in the core and peripheral circuit region is removed via an etching process using the mask pattern. Thereafter, the second oxide film 260 and the first nitride film 250 are sequentially etching via a dry-etching method using the exposed gate upper insulating film 490 in the core and peripheral circuit region as an etching mask. The remaining mask pattern is then removed. After that, a predetermined ion implantation process is performed to form an LDD region 340 at both sides of the gate of the n/p-MOS transistors in the core and peripheral circuit region, respectively. Here, the LDD region 340 can be formed without the etching process of the first nitride film 250.

Figure 11D:
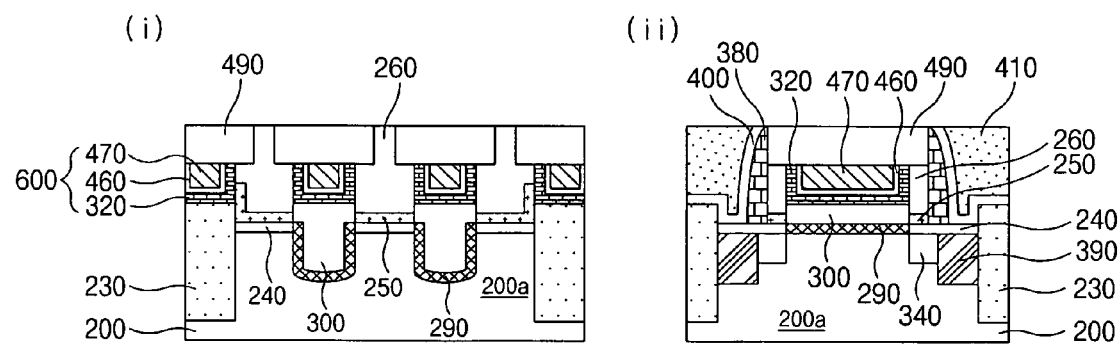

Referring to FIG. 11d, a fourth oxide film (not shown) is deposited, and then etched via a dry-etching method to form a gate sidewall insulating film 380 at the sidewall of the gate in the core and peripheral circuit region. Next, a mask pattern (not shown) exposing only the cell region is formed. The third oxide film 500 in the cell region is etched using the mask pattern as an etching mask. Thereafter, a predetermined ion implantation process is performed to form S/D regions 390 at both sides of the gate of the n/p-MOS transistors in the core and peripheral circuit region, respectively. After that, a fourth nitride film 400 and a first interlayer insulating film 430 are sequentially formed. The first interlayer insulating film 430, the fourth nitride film 400 and the gate sidewall insulating film 380 are polished via a CMP process until the gate upper insulating film 490 is exposed.

Figure 11E:
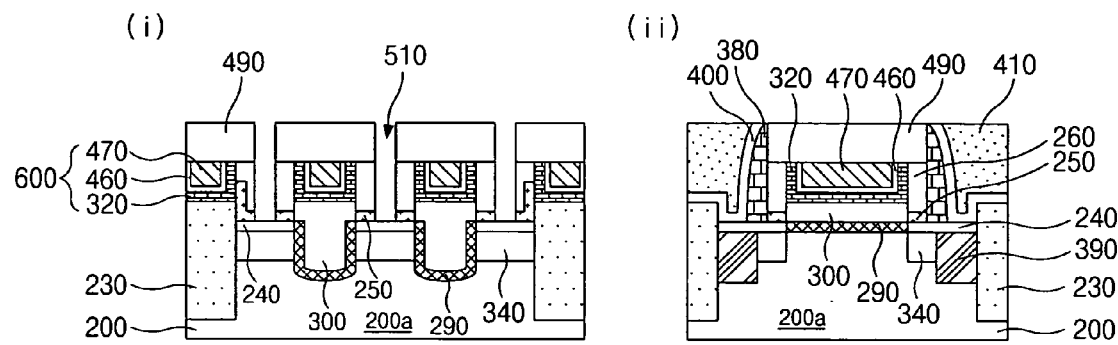

Referring to FIG. 11e, a mask pattern (not shown) for exposing a contact plug region is formed. The second oxide film 260 and the first nitride film 250 in the cell region are sequentially etched via a dry-etching method using the mask pattern as an etching mask to form a contact hole. Next, the semiconductor substrate 200 below the contact hole is subjected to an ion implantation process including one of P and As and a hot treatment process to form an LDD region 340 of the cell transistor. Here, the LDD region 340 of the cell transistor can be formed without the etching process of the first nitride film 250.

Figure 11F:
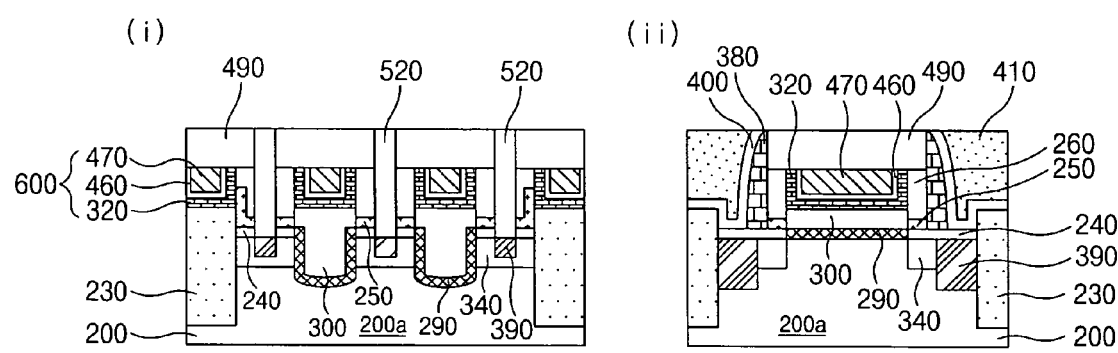

Referring to FIG. 11f, the first oxide film 240 below the contact hole is etched to expose the semiconductor substrate 200. The exposed semiconductor substrate 200 is subjected to an ion implantation process including one of P and As and a heat treatment process to S/D regions 390 of the cell transistor. Next, a conductive layer for plug (not shown) filling up the contact plug to be formed is formed on the entire surface, and then etched via a CMP process until the third nitride film 330 is exposed to form a contact plug 420.

The well-known process for fabricating a cell transistor as the subsequent processes such as a process for forming a second interlayer insulating film, a process for forming a bit line contact and a bit line, a process for forming a capacitor contact and a capacitor, a process for forming a third interlayer insulating film, and a process for forming interconnect contact and interconnect can be performed to completely manufacture a DRAM.

As described above, according to the present invention, a device isolation film is etched using a mask to partially expose a channel region and the device isolation film adjacent thereof during the etching process of the recess gate region, and a semiconductor substrate is etched to form the recess gate region. Accordingly, a silicon horn in the recess gate region is prevented from being formed, thereby increasing a margin of the etching process.

In particular, the recess gate mask in accordance with the present invention is designed with an island type instead of a line type of the conventional method, wherein the recess gate mask exposes only in which the cell transistor is to be formed. The gate mask pattern defining the gate region is designed to expose the gate electrode to be formed, which is opposite to the conventional one. As a result, the semiconductor substrate is prevented from abnormally being etched in case of the excessive misalignment between the recess gate mask and the device isolation mask. Accordingly, there are advantages that the junction leakage current caused by the abnormal etching of the semiconductor substrate is inhibited and the refresh characteristic of the semiconductor device is improved.

In addition, the LDD region and S/D regions are formed. The gate barrier layer and the upper gate electrode are then formed. As a result, a high temperature heat treatment process can be skipped after the formation of the gate barrier layer and the upper gate electrode. Accordingly, the electric malfunction of the semiconductor device occurring due to the interface characteristics among the upper gate electrode, the gate barrier layer and the lower gate electrode is improved.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device, comprising the steps of:
    (a) forming a device isolation film in a semiconductor substrate to define an active region;
    (b) forming a first oxide film on the active region;
    (c) sequentially forming a first nitride film, a planarized second oxide film and a second nitride film on an entire surface;
    (d) etching the second nitride film and the second oxide film where a gate region is to be formed, to expose the first nitride film;
    (e) forming a mask pattern having a window at least exposing an island type recess gate region in the cell region, wherein the window is respectively larger than line widths of the gate region and the active region to expose the first nitride film on the active region of the gate region in the cell region and a predetermined portion of the active region and the device isolation film adjacent thereto;
    (f) removing the exposed first nitride film and the first oxide film etched using the mask pattern;
    (g) etching a predetermined thickness of the semiconductor substrate and the device isolation film exposed via removing the first oxide film to form a recessed gate region;
    (h) forming a gate insulating film on the exposed semiconductor substrate;
    (i) forming a conductive layer for lower gate electrode on an entire surface, and then etching the conductive layer for lower gate electrode until the device isolation film is exposed to form a first lower gate electrode at least filling up the recessed gate region;

(j) forming a second lower gate electrode on the surface of the gate region and a third nitride film filling up the gate region;

(k) removing the second oxide film, the first nitride film and the first oxide film, and then forming a third nitride film on an entire surface;

(l) forming an LDD region in the semiconductor substrate at both sides of the first lower gate electrode;

(m) forming a fourth nitride film and a fourth oxide film on an entire surface, and then etching only the fourth oxide film and the fourth nitride film in the peripheral circuit region to form a spacer on a sidewall of the second lower gate electrode in the peripheral circuit region and forming S/D regions on the semiconductor substrate at both sides of the spacer;

(n) removing the fourth oxide film in the cell region, and then forming a fifth nitride film and a first interlayer insulating film on an entire surface and performing the CMP process to expose the third nitride film;

(o) etching a predetermined region of the first interlayer insulating film, the fifth nitride film, the fourth nitride film and the third oxide film on the S/D regions in the cell region to expose the semiconductor substrate and forming the S/D regions in the exposed semiconductor substrate;

(p) forming a stacked structure of a contact plug and a fifth oxide film on the S/D regions;

(q) removing the third nitride film and etching a predetermined thickness of the third oxide film and the fifth oxide film;

(r) sequentially forming a third lower gate electrode and a gate barrier layer on the second lower gate electrode, and then forming an upper gate electrode filling up the gate region to form a gate structure;

(s) etching a predetermined thickness of the gate structure;

(t) removing the exposed portion of the third oxide film, the fourth nitride film, the fifth nitride film and the fifth oxide film via an etching process; and (u) forming an upper insulating film on an entire surface, and then performing the CMP process to expose the contact plug.

2. The method according to claim 1, wherein the window exposes the island type recess gate region to be formed and the active region and the device isolation film therebetween.

3. The method according to claim 2, wherein a line width of the gate structure in the island type recess gate region is smaller than that of the gate structure on the device isolation film.

4. The method according to claim 2, wherein a line width of the gate structure in the island type recess gate region is larger than that of the gate structure on the device isolation film.

5. The method according to claims 1, wherein a width of the window is larger than the line width $F_x$ of the gate region by 2D and a height of the window is larger than the line width $F_y$ of the active region by 2E, where $-(\frac{1}{3})F_x \leq D \leq 0.5F_x$ and $0 \leq E \leq 0.5F_y$.

6. A method for fabricating a semiconductor device, comprising the steps of:

(a) forming a device isolation film in a semiconductor substrate defining an active region;

(b) forming a first oxide film on the active region;

(c) sequentially forming a first nitride film, a planarized second oxide film and a second nitride film on an entire surface;

(d) etching the second nitride film and the second oxide film where a gate region is to be formed, to expose the first nitride film;

(e) forming a mask pattern having a window at least exposing an island type recess gate region, wherein the window is respectively larger than line widths of the gate region and the active region to expose the first nitride film on the active region of the gate region in the cell region and a predetermined region of the active region and the device isolation film adjacent thereto;

(f) removing the exposed first nitride film and the first oxide film etched using the mask pattern;

(g) etching a predetermined thickness of the semiconductor substrate and the device isolation film exposed via removing the first oxide film to form a recessed gate region;

(h) forming a gate insulating film on the exposed semiconductor substrate;

(i) forming a conductive layer for lower gate electrode on an entire surface, and then etching the conductive layer for lower gate electrode until the device isolation film is exposed to form a first lower gate electrode at least filling up the recessed gate region;

(j) sequentially forming a second lower gate electrode, a third lower gate electrode and a gate barrier layer on the surface of the gate region, and then forming an upper gate electrode filling up the gate region to form a gate structure;

(k) etching a predetermined thickness of the exposed sidewall of the second oxide film;

(l) forming an upper gate insulating film on an entire surface, and then performing the CMP process until the second oxide film is exposed;

(m) forming a third oxide film on an entire surface of the cell region;

(n) etching the second oxide film in the peripheral circuit region using the upper gate insulating film as an etching mask, thereby remaining of the second oxide film only on the sidewall of the gate structure;

(o) forming an LDD region in the semiconductor substrate on both sides of the gate structure in the peripheral circuit region;

(p) forming a gate sidewall insulating film on a sidewall of the gate structure in the peripheral circuit region;

(q) forming S/D regions in the semiconductor substrate on both sides of the gate sidewall insulating film in the peripheral circuit region;

(r) forming a fourth nitride film and a first interlayer insulating film on an entire surface, and then performing the CMP process until the upper gate insulating film is exposed;

(s) etching a predetermined portion of the second oxide film and the first nitride film in the cell region to form a contact hole;

(t) subjecting an ion implant process to the semiconductor substrate below the bottom of the contact hole to form an LDD region;

(u) etching the first oxide film on the bottom of the contact hole to expose the semiconductor substrate thereunder, and then subjecting an ion implant process to the exposed semiconductor substrate to form S/D regions; and (v) forming a contact plug filling up the contact hole.

7. The method according to claim 6, wherein the window exposes the island type recess gate region to be formed and the active region and the device isolation film therebetween.

8. The method according to claim 7, wherein a line width of the gate structure in the island type recess gate region is smaller than that of the gate structure on the device isolation film.

9. The method according to claim 7, wherein a line width of the gate structure in the island type recess gate region is larger than that of the gate structure on the device isolation film.

10. The method according to claim 6, wherein a width of the window is larger than the line width $F_x$ of the gate region by 2D and a height of the window is larger than the line width $F_y$ of the active region by 2E, where $-(1/3)F_x \leq D \leq 0.5F_x$ and $0 \leq E \leq 0.5F_y$.

* * * * *